(12) United States Patent
Na et al.

(10) Patent No.: US 9,450,428 B2
(45) Date of Patent: Sep. 20, 2016

(54) PACKAGE MODULE OF BATTERY PROTECTION CIRCUIT

(75) Inventors: Hyeok-Hwi Na, Cheongju-si Chungbuk (KR); Young-Seok Kim, Cheongju-si Chungbuk (KR); Sang-Hoon Ahn, Cheongju-si Chungbuk (KR); Sung-Beum Park, Guri-si Gyeonggi-do (KR); Seung-Wook Park, Cheonan-si Chungcheongnam-do (KR); Hyun-Mok Cho, Cheongji-si Chungbuk (KR); Sun-Bok Park, Chungbuk (KR); Jae-Goo Park, Chungbuk (KR); Ho-Suk Hwang, Gunpo-si Gyeonggi-do (KR)

(73) Assignee: ITM SEMICONDUCTOR CO., LTD., Chungbuk (KR)

( * ) Notice: Subject to any disclaimer, the term of this patent is extended or adjusted under 35 U.S.C. 154(b) by 245 days.

(21) Appl. No.: 14/351,321

(22) PCT Filed: Aug. 20, 2012

(86) PCT No.: PCT/KR2012/006593
§ 371 (c)(1),
(2), (4) Date: Jun. 30, 2014

(87) PCT Pub. No.: WO2013/055026
PCT Pub. Date: Apr. 18, 2013

(65) Prior Publication Data
US 2014/0347776 A1   Nov. 27, 2014

(30) Foreign Application Priority Data

Oct. 11, 2011 (KR) ........................ 10-2011-0103628

(51) Int. Cl.
*H02J 7/00* (2006.01)
*H02H 1/00* (2006.01)
(Continued)

(52) U.S. Cl.
CPC .............. *H02J 7/0029* (2013.01); *H01M 2/34* (2013.01); *H01M 10/4257* (2013.01);
(Continued)

(58) Field of Classification Search
CPC .. H01M 2/0217; H01M 2/0473; H01M 2/34; H01M 10/0525; H01M 10/4257; H01M 2010/4271; H01M 2200/00; H01M 2200/103; H01M 2200/106; H02H 1/0038; H02H 3/085; H02H 7/18; H02J 7/0029; Y02E 60/122; Y02P 70/54
USPC ...................................................... 361/93.7
See application file for complete search history.

(56) References Cited

U.S. PATENT DOCUMENTS

2006/0076930 A1*   4/2006   Ooshita ................ H01M 10/42
320/134

FOREIGN PATENT DOCUMENTS

| CN | 101119035 A | 2/2008 |
| JP | 2006-004773 A | 1/2006 |

(Continued)

OTHER PUBLICATIONS

International Search Report mailed Feb. 7, 2013; PCT/KR2012/006593.

*Primary Examiner* — Thienvu Tran
*Assistant Examiner* — Kevin J Comber
(74) *Attorney, Agent, or Firm* — Ladas & Parry LLP

(57) ABSTRACT

Disclosed is a package module of a battery protection circuit. The package module comprises: a first internal connection terminal area and a second internal connection terminal area, and in which first and second internal connection terminals connected to a battery can provided with a bare cell are respectively disposed; an external connection terminal area, in which a plurality of external connection terminals are disposed; and a protection circuit area comprising a device area in which a plurality of passive devices forming the battery protection circuit are disposed and a chip area, which is adjacent to the device area, and in which a protection IC and a dual FET chip forming the battery protection circuit are disposed, are disposed between the external connection terminal area and the second internal connection terminal area.

6 Claims, 12 Drawing Sheets

(51) Int. Cl.
   *H02H 3/08*     (2006.01)
   *H02H 7/18*     (2006.01)
   *H01M 10/42*    (2006.01)
   *H01M 2/34*     (2006.01)
   *H01M 10/0525*  (2010.01)
   *H01M 2/02*     (2006.01)
   *H01M 2/04*     (2006.01)

(52) U.S. Cl.
   CPC .......... *H02H 1/0038* (2013.01); *H02H 3/085* (2013.01); *H02H 7/18* (2013.01); *H01M 2/0217* (2013.01); *H01M 2/0473* (2013.01); *H01M 10/0525* (2013.01); *H01M 2010/4271* (2013.01); *H01M 2200/00* (2013.01); *H01M 2200/103* (2013.01); *H01M 2200/106* (2013.01); *Y02P 70/54* (2015.11)

(56) References Cited

FOREIGN PATENT DOCUMENTS

| | | |
|---|---|---|
| JP | 2006-210120 A | 8/2006 |
| KR | 20070096647 A | 10/2007 |
| KR | 20110071798 A | 6/2011 |
| WO | 2011/078447 A1 | 6/2011 |

\* cited by examiner (a)  (b)

PACKAGE MODULE OF BATTERY PROTECTION CIRCUIT

TECHNICAL FIELD

The present invention relates to a package module of a battery protection circuit, and more particularly, to a package module of a battery protection circuit capable of being reduced in size and being easily mounted on a battery pack or a battery can.

BACKGROUND ART

In general, batteries are used in mobile devices such as a mobile phone and a personal digital assistant (PDA).

Lithium ion batteries are the most broadly used in mobile devices. However, the lithium ion batteries are heated when overcharge or overcurrent occurs. Furthermore, if they are continuously heated and thus an increase in temperature occurs, a risk of explosion as well as a reduction in performance may be caused.

Accordingly, a typical battery has mounted thereon a protection circuit module for sensing and preventing overcharge, overdischarge, and overcurrent, or is connected to an external protection circuit for sensing overcharge, overdischarge, and heating, and interrupting the operation of a battery.

The above-described conventional protection circuit is generally formed by soldering a protection integrated circuit (IC), two field effect transistors (FETs), a resistor, and a capacitor to a printed circuit board (PCB) substrate. However, the conventional protection circuit is not easily reduced in size because the space taken by the protection IC, the two FETs, the resistor, and the capacitor is excessively large.

Also, an additional process is required to mount the protection circuit on a battery pack. Furthermore, after the protection circuit is mounted, external or internal connection terminals of the protection circuit should be connected via patterns or exposed terminals of the PCB substrate by additionally performing wiring or wire bonding.

DETAILED DESCRIPTION OF THE INVENTION

Technical Problem

The present invention provides a package module of a battery protection circuit capable of solving the above-described conventional problems.

The present invention also provides a package module of a battery protection circuit capable of being easily integrated and reduced in size.

The present invention also provides a package module of a battery protection circuit capable of being easily mounted on a battery pack or a battery can.

Technical Solution

According to an aspect of the present invention, there is provided a package module of a battery protection circuit, the package module including first and second internal connection terminal areas individually disposed at two side edges of the package module and for respectively disposing first and second internal connection terminals to be connected to a battery can including a bare cell; an external connection terminal area adjacent to the first internal connection terminal area and for disposing a plurality of external connection terminals; and a protection circuit area including a device area for disposing a plurality of passive devices for forming the battery protection circuit, and a chip area adjacent to the device area and for disposing a protection integrated circuit (IC) and a dual field effect transistor (FET) chip for forming the battery protection circuit, and disposed between the external connection terminal area and the second internal connection terminal area, wherein the package module is packaged to expose the plurality of external connection terminals on an upper surface of the package module, and to expose the first and second internal connection terminals on a lower surface of the package module.

The dual FET chip including first and second FETs having a common drain, and the protection IC for controlling overdischarge and overcharge may be stacked vertically or may be disposed adjacent to each other on the chip area, and the plurality of passive devices including at least one resistor and at least one capacitor may be individually disposed to connect at least two of a plurality of conductive lines to each other on the device area.

The package module may have a lead frame structure including a die pad disposed on the chip area and for mounting the protection IC and the dual FET chip; first through sixth passive device leads disposed on the device area so as to form the plurality of conductive lines; first through third external connection terminal leads disposed on the external connection terminal area so as to form the plurality of external connection terminals; a first internal connection terminal lead extending from the first external connection terminal lead from among the plurality of external connection terminal leads, and disposed on the first internal connection terminal area so as to form the first internal connection terminal; and a second internal connection terminal lead disposed on the second internal connection terminal area so as to form the second internal connection terminal.

A discharge blocking signal output terminal of the protection IC may output a discharge blocking signal for turning off the first FET in an overdischarge state, and may be electrically connected to a gate terminal of the first FET via wire bonding, a charge blocking signal output terminal of the protection IC may output a charge blocking signal for turning off the second FET in an overcharge state, and may be electrically connected to a gate terminal of the second FET via wire bonding, a reference voltage terminal of the protection IC may be electrically connected to a source terminal of the first FET or the third passive device lead via wire bonding, the first passive device lead may be electrically connected to the first external connection terminal lead via wire bonding, the second passive device lead may be electrically connected to a voltage application terminal of the protection IC, which applies a charge voltage and a discharge voltage, via wire bonding, the third passive device lead may be electrically connected to the source terminal of the first FET and the second internal connection terminal lead via wire bonding, the fourth passive device lead may be electrically connected to the second external connection terminal lead via wire bonding, the fifth passive device lead may be electrically connected to a source terminal of the second FET and the third external connection terminal lead via wire bonding, the sixth passive device lead may be electrically connected to a sensing terminal of the protection IC, which senses a charge/discharge state, via wire bonding, a first resistor from among the plurality of passive devices may be disposed between the first and second passive device leads, a second resistor from among the plurality of passive devices may be disposed between the fifth and sixth passive device leads, a third resistor for forming a surge protection circuit from among the plurality of passive devices may be disposed between the fourth and fifth passive device leads, a first capacitor from among the plurality of passive devices may be disposed between the second and third passive device leads, a second capacitor from among the plurality of passive devices may be disposed between the third and fifth passive device leads, and a varistor for forming the surge protection circuit from among the plurality of passive devices may be disposed in parallel with the third resistor and between the fourth and fifth passive device leads.

The package module may have a structure in which the chip area, the device area, the external connection terminal area, and the first and second internal connection terminal areas are disposed on one base substrate selected from the group consisting of a printed circuit board (PCB) substrate, a ceramic substrate, and a plastic substrate, first through third external connection terminals are disposed on the external connection terminal area, the first internal connection terminal extends from the first external connection terminal and is disposed on the first internal connection terminal area, the second internal connection terminal is disposed on the second internal connection terminal area, and first through sixth conductive lines extend to at least one area selected from the group consisting of the external connection terminal area, the chip area, and the second internal connection terminal area, and are disposed on the device area.

A discharge blocking signal output terminal of the protection IC may output a discharge blocking signal for turning off the first FET in an overdischarge state, and may be electrically connected to a gate terminal of the first FET via wire bonding, a charge blocking signal output terminal of the protection IC may output a charge blocking signal for turning off the second FET in an overcharge state, and may be electrically connected to a gate terminal of the second FET via wire bonding, a reference voltage terminal of the protection IC may be electrically connected to a source terminal of the first FET or the third conductive line via wire bonding, the first conductive line may be disposed on the device area, may extend to the external connection terminal area, and may be electrically connected to the first external connection terminal, the second conductive line may be disposed on the device area, may extend to the chip area, and may be electrically connected to a voltage application terminal of the protection IC, which applies a charge voltage and a discharge voltage, via wire bonding, the third conductive line may be disposed on the device area, may extend to the chip area and the second internal connection terminal area, and may be electrically connected to the source terminal of the first FET and the second internal connection terminal, the fourth conductive line may be disposed on the device area, may extend to the external connection terminal area, and may be electrically connected to the second external connection terminal, the fifth conductive line may be disposed on the device area, may extend to the external connection terminal area, and may be electrically connected to a source terminal of the second FET and the third external connection terminal, the sixth conductive line may be disposed on the device area, may extend to the chip area, and may be electrically connected to a sensing terminal of the protection IC, which senses a charge/discharge state, a first resistor from among the plurality of passive devices may be disposed between the first and second conductive lines, a second resistor from among the plurality of passive devices may be disposed between the fifth and sixth conductive lines, a third resistor for forming a surge protection circuit from among the plurality of passive devices may be disposed between the fourth and fifth conductive lines, a first capacitor from among the plurality of passive devices may be disposed between the second and third conductive lines, a second capacitor from among the plurality of passive devices may be disposed between the third and fifth conductive lines, and a varistor for forming the surge protection circuit from among the plurality of passive devices may be disposed in parallel with the third resistor and between the fourth and fifth conductive lines.

A positive temperature coefficient (PTC) thermistor (resistor) or a fuse for suppressing overcurrent of a battery pack may be additionally disposed between the third conductive line and the second internal connection terminal.

The package module may be mounted on the battery can so as to form a battery pack.

The package module may have an upper case structure to be mounted on the battery can so as to form a battery pack.

Advantageous Effects

According to the present invention, since a plurality of passive devices, chips, external connection terminals, and internal connection terminals for forming a battery protection circuit may be formed as one package module by using a lead frame structure or a base substrate such as a printed circuit board (PCB), ceramic, or plastic substrate, in comparison to a conventional protection circuit that requires an additional modularization process, the package module according to the present invention may minimize its manufacturing process, may be easily mounted on a battery can, and may be easily reduced in size.

BEST MODE

Hereinafter, the present invention will be described in detail by explaining embodiments of the invention with reference to the attached drawings. The invention may, however, be embodied in many different forms and should not be construed as being limited to the embodiments set forth herein; rather, these embodiments are provided so that this disclosure will be thorough and complete, and will fully convey the concept of the invention to one of ordinary skill in the art.

Figure 1:
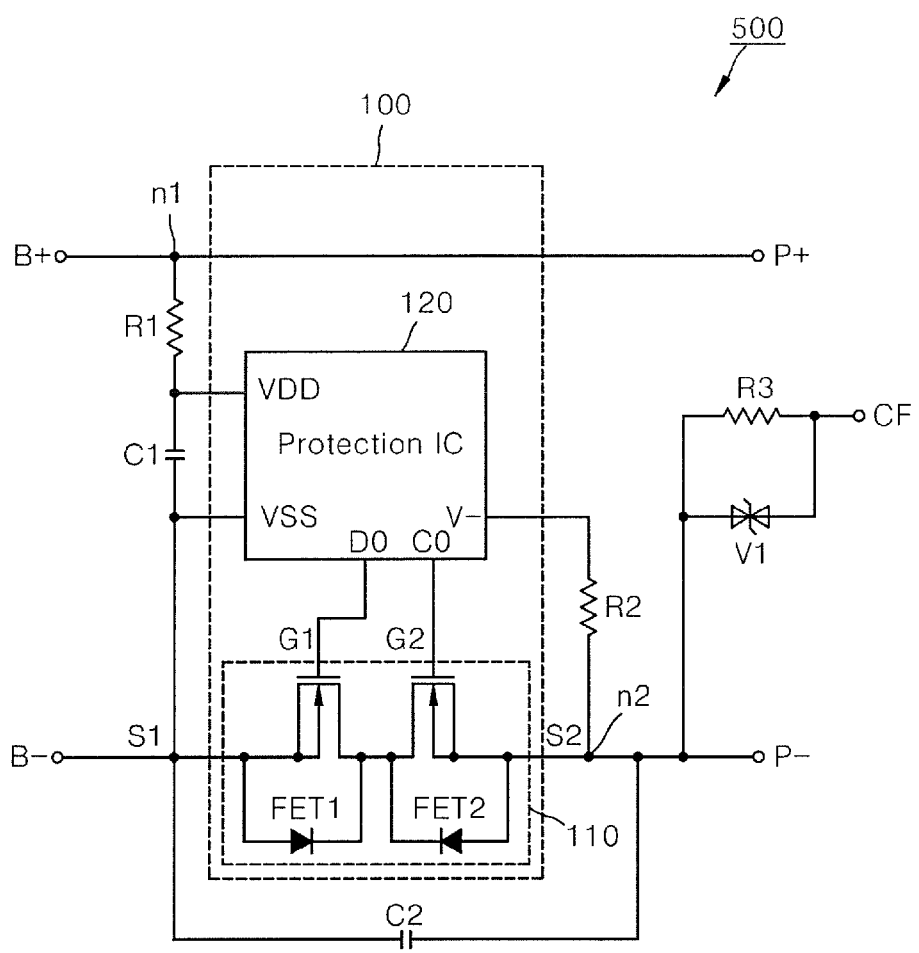
FIG. 1 is a circuit diagram of a battery protection circuit for forming a package module, according to the present invention.

FIG. 1 is a circuit diagram of a battery protection circuit 500 for forming a package module, according to the present invention.

As illustrated in FIG. 1, the battery protection circuit 500 according to the present invention includes first and second internal connection terminals B+ and B− to be connected to a battery cell, and first through third external connection terminals P+, CF, and P− to be connected to a charger in a charge operation, and to be connected to an electronic device (e.g., a mobile device) driven by using battery power, in a discharge operation. Here, from among the first through third external connection terminals P+, CF, and P−, the first and third external connection terminals P+ and P− are used to supply power and the second external connection terminal CF functions as a protection terminal for battery cell capacity measurement, electrostatic discharge (ESD), and surge protection.

In the battery protection circuit 500, a dual field effect transistor (FET) chip 110, a protection integrated circuit (IC) 120, first through third resistors R1, R2, and R3, a varistor V1, and first and second capacitors C1 and C2 are connected.

The dual FET chip 110 consists of first and second FETs FET1 and FET2 having a common drain.

The protection IC 120 has a voltage application terminal VDD connected via the first resistor R1 to the first internal connection terminal B+ that is a (+) terminal of a battery, and for applying a charge or discharge voltage via a first node n1 and sensing a voltage of the battery, a reference voltage terminal VSS functioning as a reference with respect to an operating voltage inside the protection IC 120, a sensing terminal V− for sensing charge/discharge and overcurrent states, a discharge blocking signal output terminal DO for turning off the first FET FET1 in an overdischarge state, and a charge blocking signal output terminal CO for turning off the second FET FET2 in an overcharge state.

In this case, the protection IC 120 includes a reference voltage setup unit, a comparison unit for comparing a reference voltage and a charge/discharge voltage, an overcurrent detection unit, and a charge/discharge detection unit. Here, a condition for determining a charge or discharge state may be changed according to specifications required by a user, and a charge or discharge state is determined based on the condition by recognizing a voltage difference between terminals of the protection IC 120.

In the protection IC 120, if an overdischarge state occurs in a discharge operation, the discharge blocking signal output terminal DO changes to a low state so as to turn off the first FET FET1. If an overcharge state occurs, the charge blocking signal output terminal CO changes to a low state so as to turn off the second FET FET2. If an overcurrent occurs, the second FET FET2 is turned off in a charge operation, and the first FET FET1 is turned off in a discharge operation.

The first resistor R1 and the first capacitor C1 stabilize variations in power supply of the protection IC 120. The first resistor R1 is connected between the first node n1, i.e., a power supply node of the battery, and the voltage application terminal VDD of the protection IC 120, and the first capacitor C1 is connected between the voltage application terminal VDD and the reference voltage terminal VSS of the protection IC.

Here, the first node n1 is connected to the first internal connection terminal B+ and the first external connection terminal P+.

If the first resistor R1 has a high resistance, since a high voltage is detected due to a current flowing into the protection IC 120, the first resistor R1 is set to have an appropriate resistance equal to or lower than 1 KΩ. Also, for a stable operation, the first capacitor C1 has an appropriate capacitance equal to or higher than 0.01 μF.

The first and second resistors R1 and R2 function as a current-limiting resistor if a high-voltage charger exceeding an absolute maximum rating is connected to the protection IC 120, or a charger is connected with reverse polarities. The second resistor R2 is connected between the sensing terminal V− of the protection IC 120 and a second node n2 connected to a second source terminal S2 of the second FET FET2. Since the first and second resistors R1 and R2 may be a cause of power consumption, in general, a sum of resistances of the first and second resistors R1 and R2 is set to be higher than 1 KΩ. Also, if the second resistor R2 has an excessively high resistance, since recovering after blocking overcharge may not occur, the second resistor R2 is set to have a resistance equal to or lower than 10 KΩ.

The second capacitor C2 is connected between the second node n2 (or the third external connection terminal P−) and a first source terminal S1 of the first FET FET1 (or the reference voltage terminal VSS or the second internal connection terminal B−). The second capacitor C2 does not greatly influence characteristics of the battery protection circuit 500, but is added due to a request of the user, or for stability. The second capacitor C2 is used to stabilize a system by improving a tolerance to a voltage variation or external noise.

The third resistor R3 and the varistor V1 are devices for ESD and surge protection, and are connected to each other in parallel between the second external connection terminal CF and the second node n2 (or the third external connection terminal P−). The varistor V1 is a device having a resistance to be reduced when overvoltage occurs. If overvoltage occurs, since the resistance of the varistor V1 is reduced, a problem such as circuit damage due to overvoltage may be minimized.

In the present invention, the battery protection circuit 500 including the first through third external connection terminals P+, CF, and P−, and the first and second internal connection terminals B+ and B− of FIG. 1 is packaged to form a package module. A description thereof is now provided.

Figure 2:
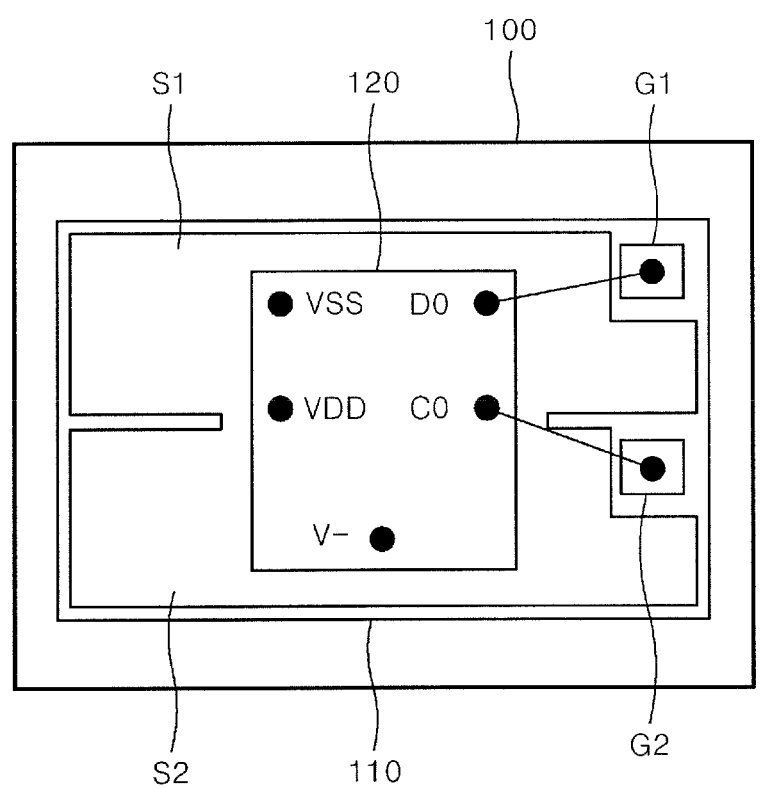
FIG. 2 is a schematic diagram showing the alignment of a stacked chip for forming a package module, according to the present invention.

FIG. 2 is a schematic diagram showing the alignment of the dual FET chip 110 and the protection IC 120 in a battery protection circuit, according to embodiments of the present invention.

As illustrated in FIG. 2, the dual FET chip 110 and the protection IC 120 are stacked vertically or are disposed adjacent to each other. For example, the protection IC 120 may be stacked on an upper surface of the dual FET chip 110, or the dual FET chip 110 may be disposed adjacent to a left or right side of the protection IC 120.

The dual FET chip 110 includes two FETs, e.g., first and second first FETs, having a common drain, and has a first gate terminal G1 and the first source terminal S1 of the first FET, and a second gate terminal G2 and the second source terminal S2 of the second FET as external connection terminals on the upper surface of the dual FET chip 110. Also, the dual FET chip 110 may have a common drain terminal on a lower surface of the dual FET chip 110.

The protection IC 120 is stacked on the upper surface of the dual FET chip 110. The protection IC 120 is stacked on an area (for example, a central area) of the dual FET chip 110 where the external connection terminals are not disposed. In this case, an insulating layer may be disposed between the protection IC 120 and the dual FET chip 110, and the protection IC 120 and the dual FET chip 110 may be bonded by using an adhesive agent formed of an insulating material.

Since the size of the dual FET chip 110 is greater than the size of the protection IC 120 in most cases, the protection IC 120 is stacked on the dual FET chip 110.

After the protection IC 120 is stacked on the upper surface of the dual FET chip 110, the discharge blocking signal output terminal DO of the protection IC 120 is electrically connected to the first gate terminal G1 of the first FET via a wire or wiring, and the charge blocking signal output terminal CO of the protection IC 120 is electrically connected to the second gate terminal G2 of the second FET via a wire or wiring. Connection structures of the other terminals will be described below.

The protection IC 120 and the dual FET chip 110 having a stacked structure as described above are collectively referred to as 'a stacked chip 100'.

Figure 3:
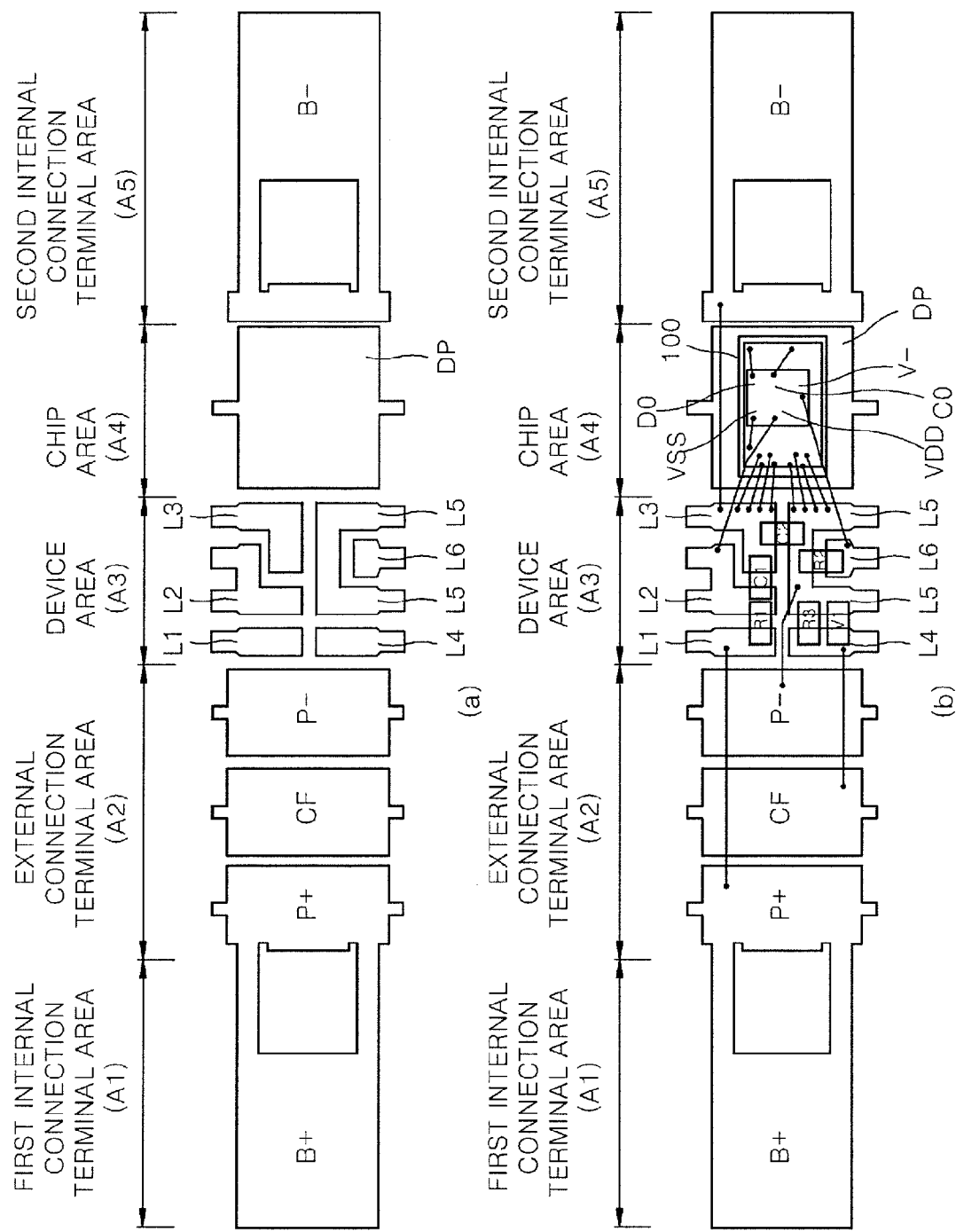
FIGS. 3A and 3B are schematic diagrams showing the internal alignment of a package module according to a first embodiment of the present invention.

FIGS. 3A and 3B are schematic diagrams showing the alignment of a package module of a battery protection circuit, according to a first embodiment of the present invention, and show a lead frame structure.

FIG. 3A shows the lead frame structure before the stacked chip 100 and passive devices are disposed, and FIG. 3B shows the lead frame structure after the stacked chip 100 and the passive devices are disposed.

As illustrated in FIG. 3A, in the package module of the battery protection circuit, according to the first embodiment of the present invention, a first internal connection terminal area A1, an external connection terminal area A2, a protection circuit area including a device area A3 and a chip area A4, and a second internal connection terminal area A5 are sequentially disposed. The protection circuit area is disposed between the external connection terminal area A2 and the second internal connection terminal area A5, and the positions of the device area A3 and the chip area A4 may be variously changed.

The first and second internal connection terminal areas A1 and A5 are disposed at two side edges of the package module, and a first internal connection terminal lead B+ functioning as a first internal connection terminal, and a second internal connection terminal lead B− functioning as a second internal connection terminal, which are connected to a battery can including a bare cell, are respectively disposed on the first and second internal connection terminal areas A1 and A5.

The external connection terminal area A2 is adjacent to the first internal connection terminal area A1, and first through third external connection terminal leads P+, CF, and P− functioning as first through third external connection terminals are sequentially disposed on the external connection terminal area A2. The positions of the first through third external connection terminal leads P+, CF, and P− may be variously changed. Here, the first external connection terminal lead P+ and the first internal connection terminal lead B+ are connected to each other. In other words, the first internal connection terminal lead B+ may extend from the first external connection terminal lead P+, or the first external connection terminal lead P+ may extend from the first internal connection terminal lead B+.

The device area A3 is an area for disposing a plurality of passive devices (R1, R2, R3, C1, C2, and V1) for forming the battery protection circuit, and first through sixth passive device leads L1, L2, L3, L4, L5, and L6 formed as a plurality of conductive lines are disposed on the device area A3.

The first through third passive device leads L1, L2, and L3 may be sequentially disposed on an upper part of the device area A3, and the fourth through sixth passive device leads L4, L5, and L6 may be disposed on a lower part of the device area A3.

The first passive device lead L1 is formed to a certain size on the device area A3 adjacent to the external connection terminal area A2, and the second passive device lead L2 is formed to a certain size so to be adjacent to the first passive device lead L1. The third passive device lead L3 is formed to a certain size on the device area A3 adjacent to the chip area A4 so as to be adjacent to the second passive device lead L2.

The fourth passive device lead L4 is formed to a certain size on the device area A3 adjacent to the external connection terminal area A2, and the fifth and sixth passive device leads L5 and L6 are disposed adjacent to the fourth passive device lead L4 in such a way that the fifth passive device lead L5 surrounds the sixth passive device lead L6.

The chip area A4 is an area adjacent to the device area A3 and for disposing a protection IC and a dual FET chip for forming the battery protection circuit, and a die pad DP for mounting the stacked chip 100 may be disposed on the chip area A4. The die pad DP may be electrically connected to a common drain terminal of the dual FET chip 110 for forming the stacked chip 100, and may be exposed in a subsequent packaging process so as to function as an external connection terminal and to improve heat radiation characteristics.

As illustrated in FIG. 3B, the passive devices (R1, R2, R3, C1, C2, and V1) and the stacked chip 100 are disposed on the lead frame structure of FIG. 3A, and a process such as wire bonding is performed so as to form the battery protection circuit 500 illustrated in FIG. 1.

Initially, the stacked chip 100 is mounted on the die pad DP of the chip area A4, and the reference voltage terminal VSS of the protection IC 120 for forming the stacked chip 100 is electrically connected to the first source terminal S1 of the first FET or the third passive device lead L3 via wire bonding.

The voltage application terminal VDD of the protection IC 120 is electrically connected to the second passive device lead L2 via a process such as wire bonding, and the sensing terminal V− of the protection IC 120 is electrically connected to the sixth passive device lead L6 via wire bonding.

The first source terminal S1 of the first FET is electrically connected to the third passive device lead L3 via a process such as wire bonding, and the second source terminal S2 of the second FET is electrically connected to the fifth passive device lead L5 via a process such as wire bonding.

Then, the first passive device lead L1 and the first external connection terminal lead P+ are electrically connected to each other via a process such as wire bonding, and the third passive device lead L3 and the second internal connection terminal lead B− are electrically connected to each other via a process such as wire bonding.

The fourth passive device lead L4 is electrically connected to the second external connection terminal lead CF via wire bonding, and the fifth passive device lead L5 is electrically connected to the third external connection terminal lead P− via a process such as wire bonding.

From among the plurality of passive devices, the first resistor R1 is disposed between the first and second passive device leads L1 and L2, and the second resistor R2 is disposed between the fifth and sixth passive device leads L5 and L6.

The third resistor R3 for forming a surge protection circuit is disposed between the fourth and fifth passive device leads L4 and L5, the first capacitor C1 is disposed between the second and third passive device leads L2 and L3, and the second capacitor C2 is disposed between the third and fifth passive device leads L3 and L5.

The varistor V1 for forming the surge protection circuit is disposed in parallel with the third resistor R3 and between the fourth and fifth passive device leads L4 and L5.

Figure 4:
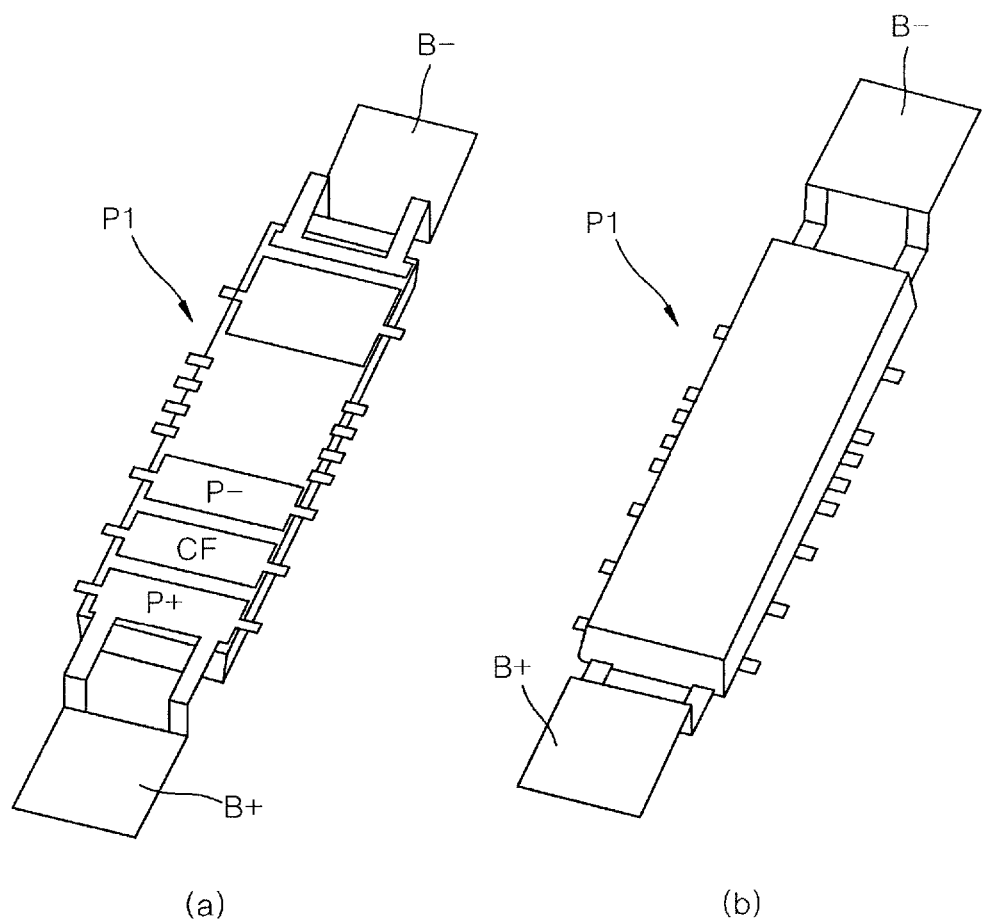
FIGS. 4A and 4B are perspective views of the package module of FIGS. 3A and 3B.

The above-described battery protection circuit is packaged via a process such as molding so as to form a package module P1 illustrated in FIGS. 4A and 4B.

FIG. 4A shows an upper surface of the package module P1 according to the first embodiment of the present invention, and FIG. 4B shows a lower surface of the package module P1.

As illustrated in FIGS. 4A and 4B, the package module P1 according to the first embodiment of the present invention is configured to expose the first through third external connection terminals P+, CF, and P− on the upper surface, and to expose the first and second internal connection terminals B+ and B− on the lower surface. Here, for heat radiation or another purpose, the package module P1 may be packaged to expose a lower surface of the die pad DP (an opposite surface to a surface where the stacked chip 100 is mounted) on the upper surface.

Figure 5:
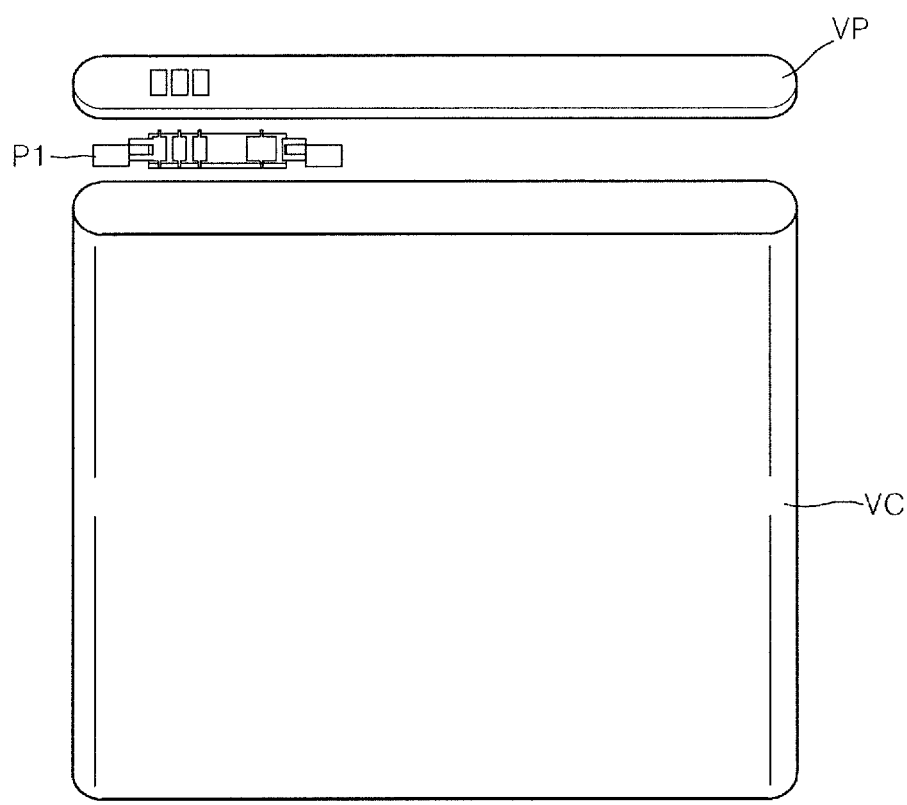
FIG. 5 is a perspective view for describing an operation of combining the package module of FIGS. 4A and 4B to a battery can.

FIG. 5 is a perspective view for describing an operation of mounting the package module P1 according to the first embodiment of the present invention, on a battery pack.

Figure 6:
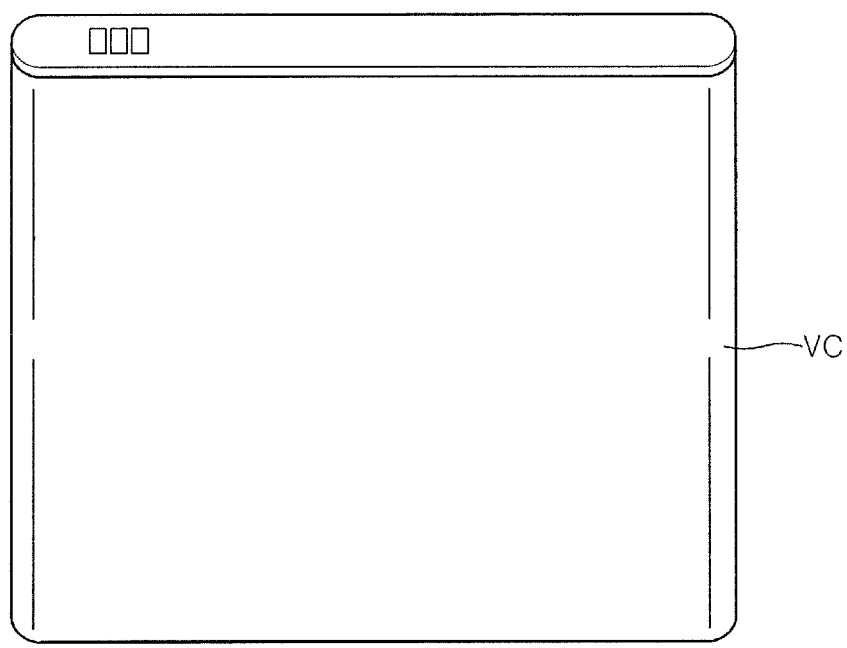
FIG. 6 is a perspective view of a battery pack having mounted thereon a package module, according to embodiments of the present invention.

As illustrated in FIG. 5, the above-described package module P1 is inserted between an upper surface of a battery can VC including a bare cell, and an upper case VP, and thus the battery pack illustrated in FIG. 6 is formed.

The upper case VP is formed of a plastic material and has holes so as to expose the first through third external connection terminals P+, CF, and P−.

Figure 7:
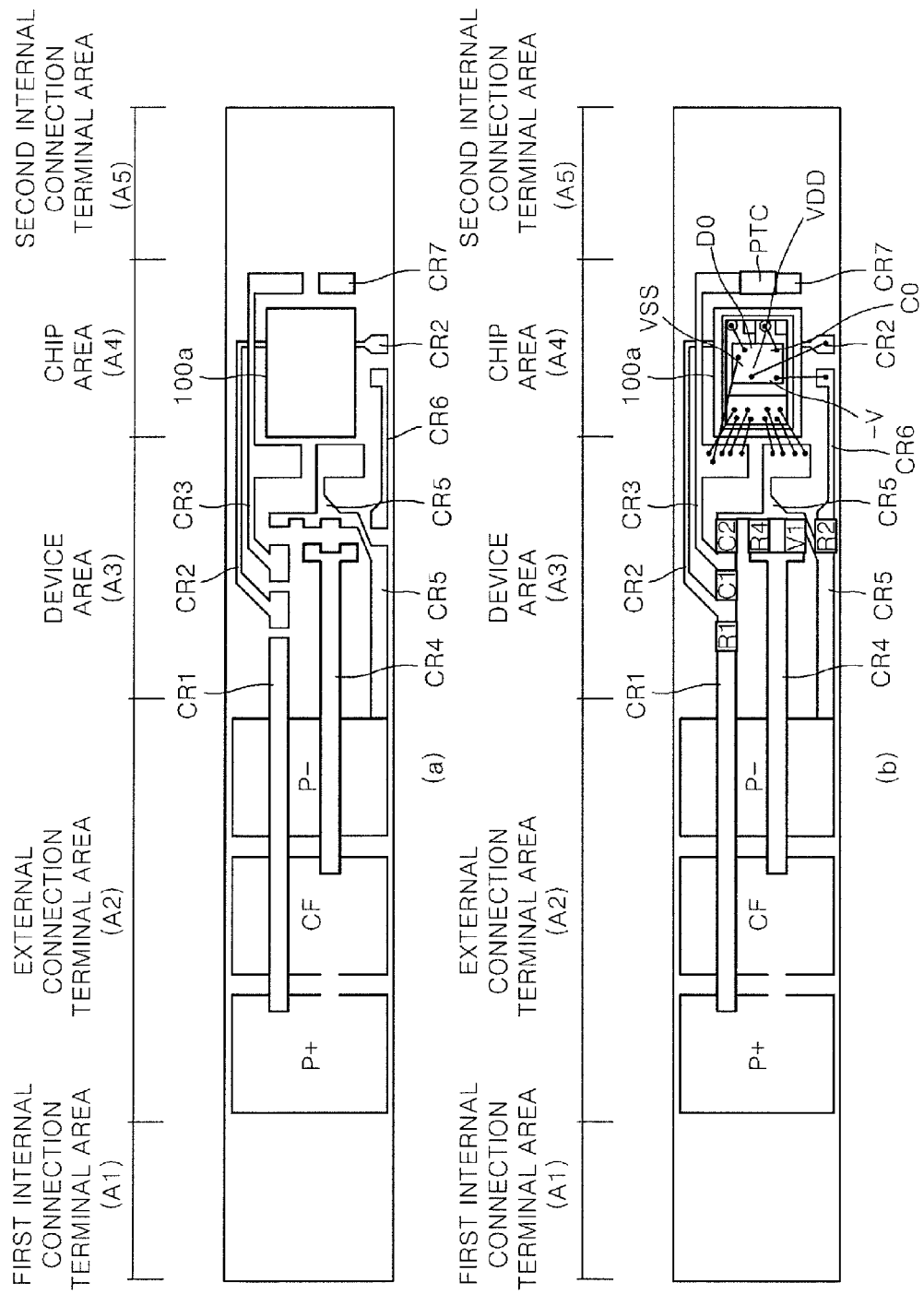
FIGS. 7A and 7B are schematic diagrams showing the internal alignment of a package module according to a second embodiment of the present invention.

FIGS. 7A and 7B are schematic diagrams showing the alignment of a package module of a battery protection circuit, according to a second embodiment of the present invention, and show that the first internal connection terminal area A1, the external connection terminal area A2, the protection circuit area including the device area A3 and the chip area A4, and the second internal connection terminal area A5 are disposed on a base substrate such as a printed circuit board (PCB) substrate or a ceramic substrate.

FIG. 7A shows a substrate structure before the stacked chip 100 and passive devices are disposed, and FIG. 7B shows the substrate structure after the stacked chip 100 and the passive devices are disposed.

As illustrated in FIG. 7A, in the package module of the battery protection circuit, according to the second embodiment of the present invention, the first internal connection terminal area A1, the external connection terminal area A2, the protection circuit area including the device area A3 and the chip area A4, and the second internal connection terminal area A5 are sequentially disposed. The protection circuit area is disposed between the external connection terminal area A2 and the second internal connection terminal area A5, and the positions of the device area A3 and the chip area A4 may be variously changed.

Figure 8:
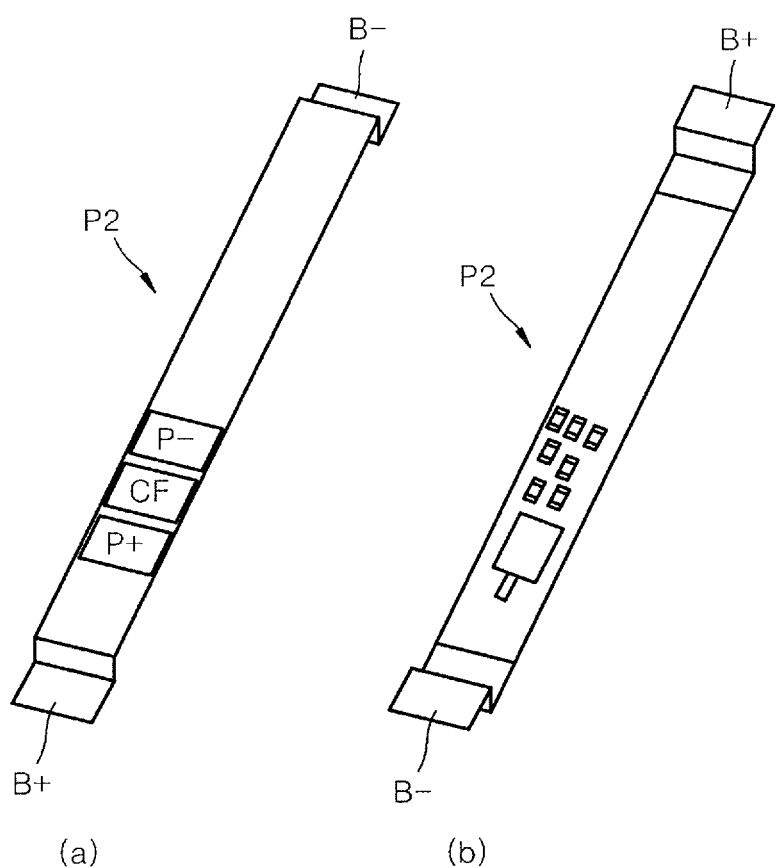
FIGS. 8A and 8B are perspective views of the package module of FIGS. 7A and 7B.

The first and second internal connection terminal areas A1 and A5 are disposed at two side edges of the package module, and the first and second internal connection terminals B+ and B− connected to a battery can including a bare cell are patterned (see FIGS. 8A and 8B).

The external connection terminal area A2 is adjacent to the first internal connection terminal area A1, and the first through third external connection terminals P+, CF, and P− are sequentially disposed on the external connection terminal area A2. The positions of the first through third external connection terminals P+, CF, and P− may be variously changed. Here, the first external connection terminal P+ and the first internal connection terminal B+ are connected to each other. In other words, the first internal connection terminal B+ may extend from the first external connection terminal P+, or the first external connection terminal P+ may extend from the first internal connection terminal B+.

The device area A3 is an area for disposing a plurality of passive devices (R1, R2, R3, C1, C2, and V1) for forming the battery protection circuit, and first through sixth conductive lines CR1, CR2, CR3, CR4, CR5, and CR6 are appropriately patterned on the device area A3.

From among the first through sixth conductive lines CR1, CR2, CR3, CR4, CR5, and CR6, the first through third conductive lines CR1, CR2, and CR3 may be disposed on an upper part of the device area A3, and the fourth through sixth conductive lines CR4, CR5, and CR6 may be disposed on a lower part of the device area A3.

The first conductive line CR1 is formed to a certain size on the device area A3 adjacent to the external connection terminal area A2, and extends to the external connection terminal area A2 so as to be electrically connected to the first external connection terminal P+.

The second conductive line CR2 is formed to a certain size on the device area A3 and may extend to the chip area A4. For example, the second conductive line CR2 may be formed to be insulated from the chip area A4 and to extend to a side of the chip area A4 on a bottom surface of the chip area A4. This is for electrical connection to the voltage application terminal VDD of the protection IC 120 via a process such as wire bonding.

The third conductive line CR3 is formed to a certain size on the device area A3 so as to be adjacent to the second conductive line CR2, and may extend to the chip area A4. For example, the third conductive line CR3 may extend to a side of the chip area A4 so as to have a terminal connection area. Also, the third conductive line CR3 may extend to the second internal connection terminal area A5 so as to be electrically connected to the second internal connection terminal B−. In this case, if the battery protection circuit further includes a positive temperature coefficient (PTC) thermistor (resistor) or a fuse for suppressing overcurrent of a battery pack, a seventh conductive line CR7 electrically connected to the second internal connection terminal B− may be additionally disposed on the second internal connection terminal area A5, and thus the PTC thermistor (resistor) or the fuse may be disposed between the third and seventh conductive lines CR3 and CR7.

The fourth conductive line CR4 is formed to a certain size on the device area A3 adjacent to the external connection terminal area A2, and extends to the external connection terminal area A2 so as to be electrically connected to the second external connection terminal CF.

The fifth conductive line CR5 is formed to a certain size on the device area A3, and extends to the external connection terminal area A2 so as to be electrically connected to the third external connection terminal P−. Also, the fifth conductive line CR5 may extend to a side of the chip area A4.

The sixth conductive line CR6 may be formed to a certain size on the device area A3, and may extend to the chip area A4.

As illustrated in FIG. 7B, the passive devices (R1, R2, R3, C1, C2, and V1) and the stacked chip 100 are disposed on the base substrate of FIG. 7A, on which the first through sixth conductive lines CR1, CR2, CR3, CR4, CR5, and CR6 are disposed, and a process such as device mounting or wire bonding is performed so as to form the battery protection circuit 500 illustrated in FIG. 1.

Initially, the stacked chip 100 is mounted on the chip area A4, and the reference voltage terminal VSS of the protection IC 120 for forming the stacked chip 100 is electrically connected to the first source terminal S1 of the first FET or the third conductive line CR3 via wire bonding.

The voltage application terminal VDD of the protection IC 120 is electrically connected to the second conductive line CR2 via a process such as wire bonding, and the sensing terminal V− of the protection IC 120 is electrically connected to the sixth conductive line CR6 via wire bonding.

The first source terminal S1 of the first FET is electrically connected to the third conductive line CR3 via a process such as wire bonding, and the second source terminal S2 of the second FET is electrically connected to the fifth conductive line CR5 via a process such as wire bonding.

From among the plurality of passive devices, the first resistor R1 is disposed between the first and second conductive lines CR1 and CR2, and the second resistor R2 is disposed between the fifth and sixth conductive lines CR5 and CR6.

The third resistor R3 for forming a surge protection circuit is disposed between the fourth and fifth conductive lines CR4 and CR5, the first capacitor C1 is disposed between the second and third conductive lines CR2 and CR3, and the second capacitor C2 is disposed between the third and fifth conductive lines CR3 and CR5.

The varistor V1 for forming the surge protection circuit is disposed in parallel with the third resistor R3 and between the fourth and fifth conductive lines CR4 and CR5.

The above-described battery protection circuit is packaged via a process such as molding (e.g., epoxy molding compound (EMC) molding) so as to form a package module P2 illustrated in FIGS. 8A and 8B. In this case, the above packaging process may include an encapsulation process or a partial molding process performed on the chip area A4 for mounting the stacked chip 100, and conductive lines wire-boned to the stacked chip 100.

If the base substrate of FIG. 7B is packaged, a lower surface of the package module P2 is achieved as illustrated in FIG. 8B. In other words, an upper surface of the base substrate of FIGS. 7A and 7B may correspond to the lower surface of the package module P2, which is illustrated in FIG. 8B, and a lower surface of the base substrate of FIGS. 7A and 7B may correspond to an upper surface of the package module P2, which is illustrated in FIG. 8A.

FIG. 8A shows the upper surface of the package module P2 according to the second embodiment of the present invention, and FIG. 8B shows the lower surface of the package module P2.

As illustrated in FIGS. 8A and 8B, the package module P2 according to the second embodiment of the present invention is configured to expose the first through third external connection terminals P+, CF, and P− on the upper surface, and to expose the first and second internal connection terminals B+ and B− on the lower surface. In this case, the package module P2 may be packaged to expose upper surfaces of the passive devices (R1, R2, R3, C1, C2, and V1).

Figure 9:
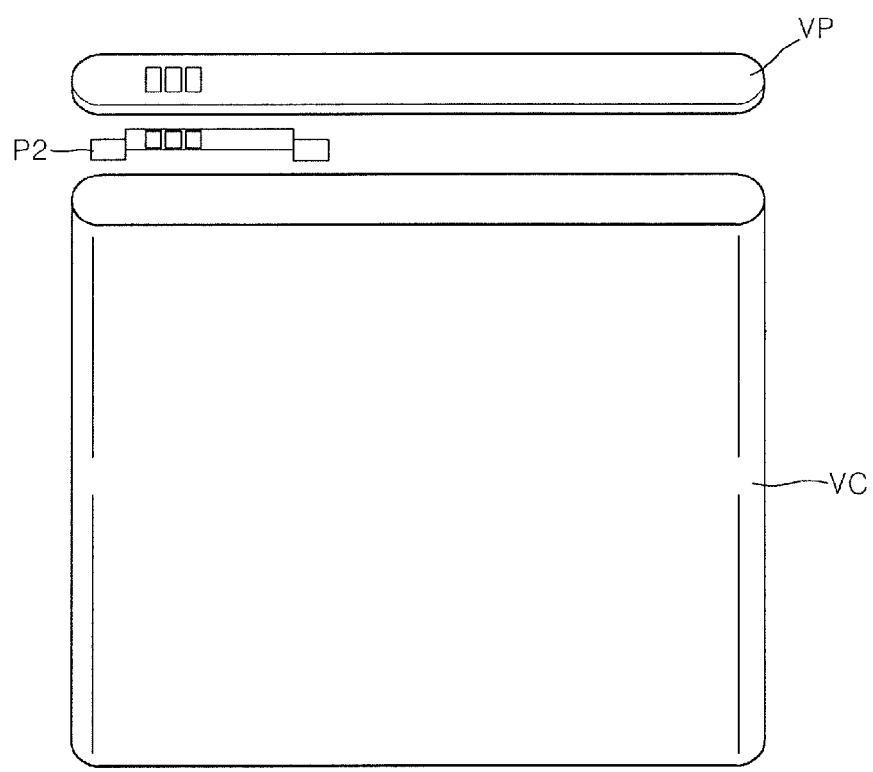
FIG. 9 is a perspective view for describing an operation of combining the package module of FIGS. 8A and 8B to a battery can.

FIG. 9 is a perspective view for describing an operation of mounting the package module P2 according to the second embodiment of the present invention, on a battery pack.

As illustrated in FIG. 9, the above-described package module P2 is inserted between an upper surface of the battery can VC including a bare cell, and the upper case VP, and thus the battery pack illustrated in FIG. 6 is formed. The upper case VP is formed of a plastic material and has holes so as to expose the first through third external connection terminals P+, CF, and P−.

Figure 10:
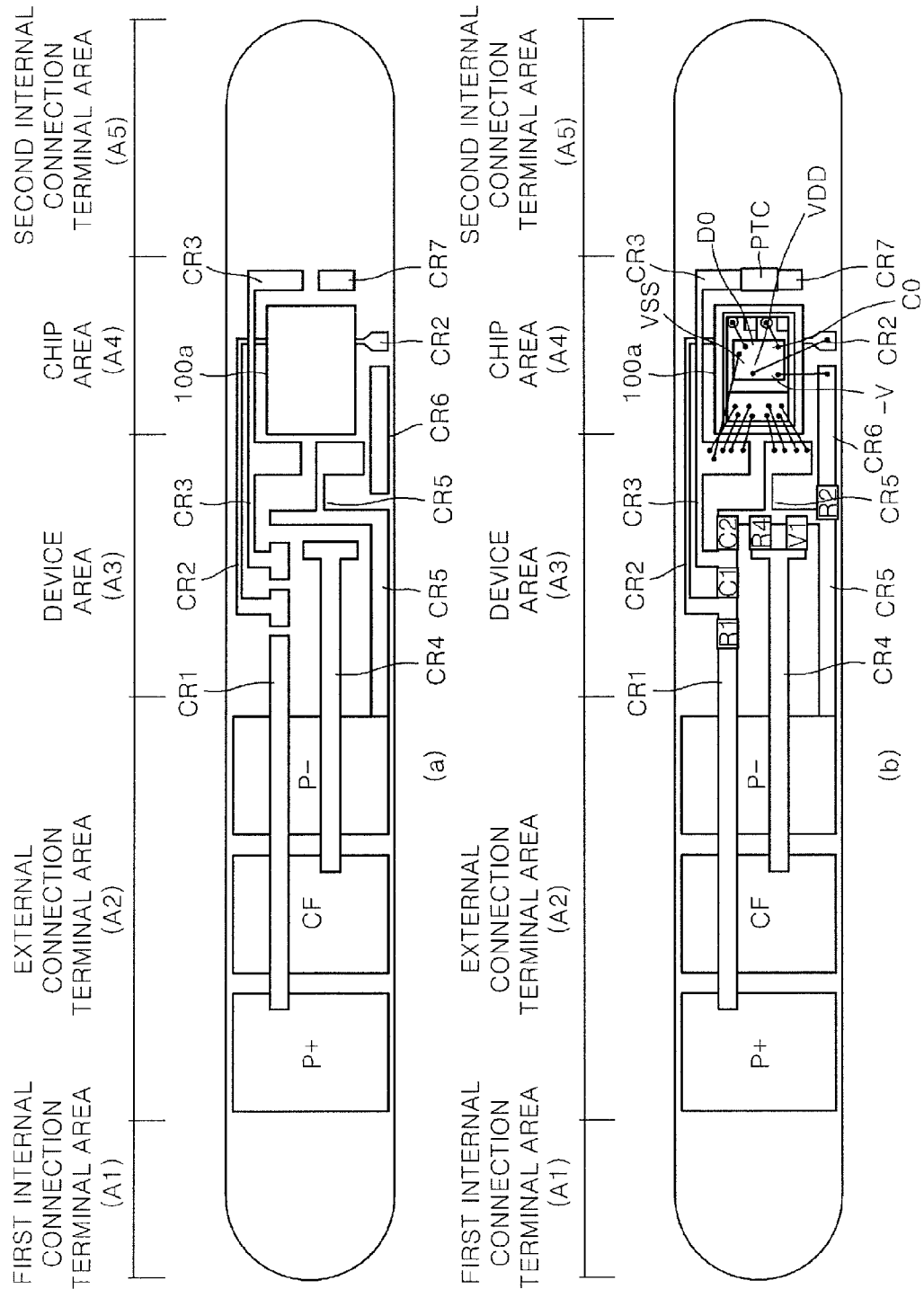
FIGS. 10A and 10B are schematic diagrams showing the internal alignment of a package module according to a third embodiment of the present invention.

FIGS. 10A and 10B are schematic diagrams showing the alignment of a package module of a battery protection circuit, according to a third embodiment of the present invention, and show that the first internal connection terminal area A1, the external connection terminal area A2, the protection circuit area including the device area A3 and the chip area A4, and the second internal connection terminal area A5 are disposed on a plastic base substrate.

FIG. 10A shows a substrate structure before the stacked chip 100 and passive devices are disposed, and FIG. 10B shows the substrate structure after the stacked chip 100 and the passive devices are disposed.

As illustrated in FIG. 10A, in the package module of the battery protection circuit, according to the third embodiment of the present invention, the first internal connection terminal area A1, the external connection terminal area A2, the protection circuit area including the device area A3 and the chip area A4, and the second internal connection terminal area A5 are sequentially disposed. The protection circuit area is disposed between the external connection terminal area A2 and the second internal connection terminal area A5, and the positions of the device area A3 and the chip area A4 may be variously changed.

Figure 11:
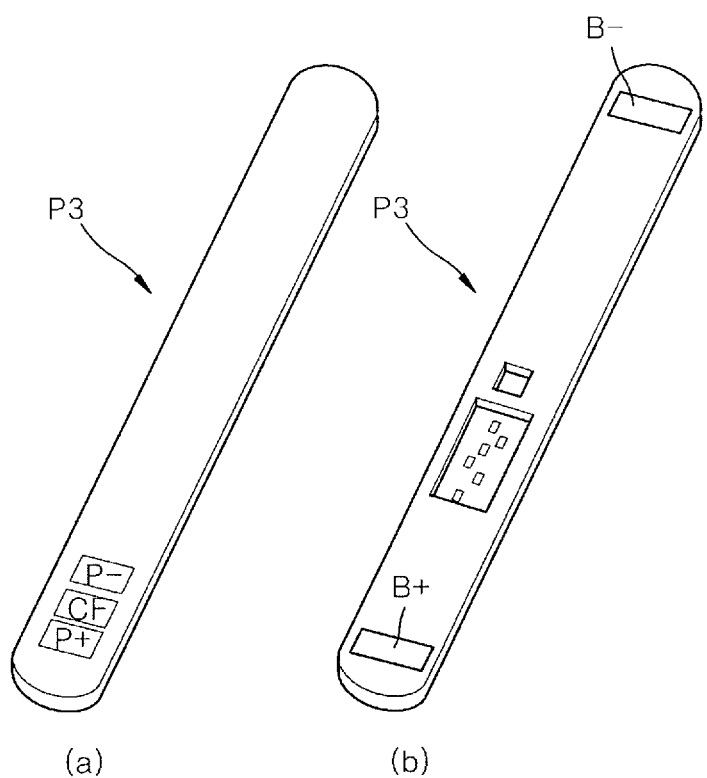
FIGS. 11A and 11B are perspective views of the package module of FIGS. 10A and 10B.

The first and second internal connection terminal areas A1 and A5 are disposed at two side edges of the package module, and the first and second internal connection terminals B+ and B− connected to a battery can including a bare cell are patterned (see FIGS. 11A and 11B).

The external connection terminal area A2 is adjacent to the first internal connection terminal area A1, and the first through third external connection terminals P+, CF, and P− are sequentially disposed on the external connection terminal area A2. The positions of the first through third external connection terminals P+, CF, and P− may be variously changed. Here, the first external connection terminal P+ and the first internal connection terminal B+ are connected to each other. In other words, the first internal connection terminal B+ may extend from the first external connection terminal P+, or the first external connection terminal P+ may extend from the first internal connection terminal B+.

The device area A3 is an area for disposing a plurality of passive devices (R1, R2, R3, C1, C2, and V1) for forming the battery protection circuit, and first through sixth conductive lines CR1, CR2, CR3, CR4, CR5, and CR6 are appropriately patterned on the device area A3.

From among the first through sixth conductive lines CR1, CR2, CR3, CR4, CR5, and CR6, the first through third conductive lines CR1, CR2, and CR3 may be disposed on an upper part of the device area A3, and the fourth through sixth conductive lines CR4, CR5, and CR6 may be disposed on a lower part of the device area A3.

The first conductive line CR1 is formed to a certain size on the device area A3 adjacent to the external connection terminal area A2, and extends to the external connection terminal area A2 so as to be electrically connected to the first external connection terminal P+.

The second conductive line CR2 is formed to a certain size on the device area A3 and may extend to the chip area A4. For example, the second conductive line CR2 may be formed to be insulated from the chip area A4 and to extend to a side of the chip area A4 on a bottom surface of the chip area A4. This is for electrical connection to the voltage application terminal VDD of the protection IC 120 via a process such as wire bonding.

The third conductive line CR3 is formed to a certain size on the device area A3 so as to be adjacent to the second conductive line CR2, and may extend to the chip area A4. For example, the third conductive line CR3 may extend to a side of the chip area A4 so as to have a terminal connection area. Also, the third conductive line CR3 may extend to the second internal connection terminal area A5 so as to be electrically connected to the second internal connection terminal B−. In this case, if the battery protection circuit further includes a PTC thermistor (resistor) or a fuse for suppressing overcurrent of a battery pack, a seventh conductive line CR7 electrically connected to the second internal connection terminal B− may be additionally disposed on the second internal connection terminal area A5, and thus the PTC thermistor (resistor) or the fuse may be disposed between the third and seventh conductive lines CR3 and CR7.

The fourth conductive line CR4 is formed to a certain size on the device area A3 adjacent to the external connection terminal area A2, and extends to the external connection terminal area A2 so as to be electrically connected to the second external connection terminal CF.

The fifth conductive line CR5 is formed to a certain size on the device area A3, and extends to the external connection terminal area A2 so as to be electrically connected to the third external connection terminal P−. Also, the fifth conductive line CR5 may extend to a side of the chip area A4.

The sixth conductive line CR6 may be formed to a certain size on the device area A3, and may extend to the chip area A4.

As illustrated in FIG. 10B, the passive devices (R1, R2, R3, C1, C2, and V1) and the stacked chip 100 are disposed on the base substrate of FIG. 10A, on which the first through sixth conductive lines CR1, CR2, CR3, CR4, CR5, and CR6 are disposed, and a process such as device mounting or wire bonding is performed so as to form the battery protection circuit 500 illustrated in FIG. 1.

Initially, the stacked chip 100 is mounted on the chip area A4, and the reference voltage terminal VSS of the protection IC 120 for forming the stacked chip 100 is electrically connected to the first source terminal S1 of the first FET or the third conductive line CR3 via wire bonding.

The voltage application terminal VDD of the protection IC 120 is electrically connected to the second conductive line CR2 via a process such as wire bonding, and the sensing terminal V− of the protection IC 120 is electrically connected to the sixth conductive line CR6 via wire bonding.

The first source terminal S1 of the first FET is electrically connected to the third conductive line CR3 via a process such as wire bonding, and the second source terminal S2 of the second FET is electrically connected to the fifth conductive line CR5 via a process such as wire bonding.

From among the plurality of passive devices, the first resistor R1 is disposed between the first and second conductive lines CR1 and CR2, and the second resistor R2 is disposed between the fifth and sixth conductive lines CR5 and CR6.

The third resistor R3 for forming a surge protection circuit is disposed between the fourth and fifth conductive lines CR4 and CR5, the first capacitor C1 is disposed between the second and third conductive lines CR2 and CR3, and the second capacitor C2 is disposed between the third and fifth conductive lines CR3 and CR5.

The varistor V1 for forming the surge protection circuit is disposed in parallel with the third resistor R3 and between the fourth and fifth conductive lines CR4 and CR5.

The above-described battery protection circuit is packaged via a process such as molding (e.g., EMC molding) so as to form a package module P3 illustrated in FIGS. 11A and 11B. In this case, the above packaging process may include an encapsulation process or a partial molding process performed on the chip area A4 for mounting the stacked chip 100, and conductive lines wire-boned to the stacked chip 100.

In the base substrate illustrated in FIGS. 10A and 10B, the patterning and device forming processes may be performed after holes are formed to correspond to the first through third external connection terminals P+, CF, and P−, or the first through third external connection terminals P+, CF, and P− may be exposed in the packaging process.

An upper surface of the base substrate of FIGS. 10A and 10B may correspond to a lower surface of the package module P3, which is illustrated in FIG. 11B, and a lower surface of the base substrate of FIGS. 10A and 10B may correspond to an upper surface of the package module P3, which is illustrated in FIG. 11A.

FIG. 11A shows the upper surface of the package module P3 according to the third embodiment of the present invention, and FIG. 11B shows the lower surface of the package module P3.

In the base substrate illustrated in FIGS. 10A and 10B, the patterning and device forming processes may be performed after holes are formed to correspond to the first through third external connection terminals P+, CF, and P−, or the first through third external connection terminals P+, CF, and P− may be exposed in the packaging process.

As illustrated in FIGS. 11A and 11B, the package module P3 according to the third embodiment of the present invention is configured to expose the first through third external connection terminals P+, CF, and P− on the upper surface, and to expose the first and second internal connection terminals B+ and B− on the lower surface. In this case, the package module P3 may be packaged to expose upper surfaces of the passive devices (R1, R2, R3, C1, C2, and V1).

In order to form the package module P3 to have a size the same as the size of a battery pack or the battery can VC for mounting the package module P3, the second internal connection terminal area A5 may extend or expand to correspond to the size of the battery pack or the battery can VC.

As such, the package module P3 may be formed to have an upper case structure to be combined with the battery can VC so as to form the battery pack. In this case, a separate upper case is not required and the battery pack is completely formed by merely mounting the package module P3 on the battery can VC.

Figure 12:
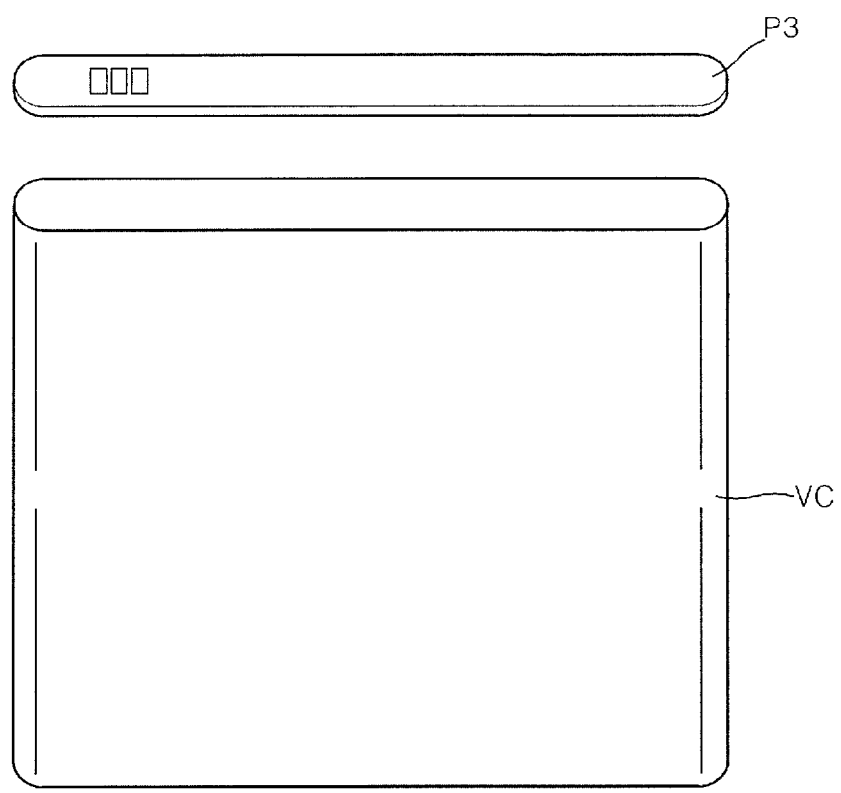
FIG. 12 is a perspective view for describing an operation of combining the package module of FIGS. 11A and 11B to a battery can.

FIG. 12 is a perspective view for describing an operation of mounting the package module P3 according to the third embodiment of the present invention, on a battery pack.

As illustrated in FIG. 12, the package module P3 is mounted on an upper surface of the battery can VC including a bare cell, and thus the battery pack illustrated in FIG. 6 is formed without using a separate upper case.

As described above, according to the present invention, since a plurality of passive devices, chips, external connection terminals, and internal connection terminals for forming a battery protection circuit may be formed as one package module by using a lead frame structure or a base substrate such as a PCB, ceramic, or plastic substrate, the package module may be easily mounted on a battery can and may be reduced in size.

While the present invention has been particularly shown and described with reference to exemplary embodiments thereof, it will be understood by one of ordinary skill in the art that various changes in form and details may be made therein without departing from the spirit and scope of the invention as defined by the following claims. The exemplary embodiments should be considered in a descriptive sense only and not for purposes of limitation. Therefore, the scope of the invention is defined not by the detailed description of the invention but by the following claims, and all differences within the scope will be construed as being included in the present invention.

The invention claimed is:

1. A package module of a battery protection circuit, the package module comprising:
    first and second internal connection terminal areas individually disposed at two side edges of the package module and for respectively disposing first and second internal connection terminals to be connected to a battery can including a bare cell;
    an external connection terminal area adjacent to the first internal connection terminal area and for disposing a plurality of external connection terminals; and
    a protection circuit area comprising a device area for disposing a plurality of passive devices for forming the battery protection circuit, and a chip area adjacent to the device area and for disposing a protection integrated circuit (IC) and a dual field effect transistor (FET) chip for forming the battery protection circuit, and disposed between the external connection terminal area and the second internal connection terminal area,
    wherein the package module is packaged to expose the plurality of external connection terminals on an upper surface of the package module, and to expose the first and second internal connection terminals on a lower surface of the package module,
    wherein the dual FET chip comprising first and second FETs having a common drain, and the protection IC for controlling overdischarge and overcharge are stacked vertically or are disposed adjacent to each other on the chip area, and
    wherein the plurality of passive devices comprising at least one resistor and at least one capacitor are individually disposed to connect at least two of a plurality of conductive lines to each other on the device area, and
    wherein the package module has a lead frame structure comprising:
    a die pad disposed on the chip area and for mounting the protection IC and the dual FET chip;
    first through sixth passive device leads disposed on the device area so as to form the plurality of conductive lines;
    first through third external connection terminal leads disposed on the external connection terminal area so as to form the plurality of external connection terminals;
    a first internal connection terminal lead extending from the first external connection terminal lead from among the plurality of external connection terminal leads, and disposed on the first internal connection terminal area so as to form the first internal connection terminal; and
    a second internal connection terminal lead disposed on the second internal connection terminal area so as to form the second internal connection terminal.

2. The package module of claim 1, wherein a discharge blocking signal output terminal of the protection IC outputs a discharge blocking signal for turning off the first FET in an overdischarge state, and is electrically connected to a gate terminal of the first FET via wire bonding,
    wherein a charge blocking signal output terminal of the protection IC outputs a charge blocking signal for turning off the second FET in an overcharge state, and is electrically connected to a gate terminal of the second FET via wire bonding,
    wherein a reference voltage terminal of the protection IC is electrically connected to a source terminal of the first FET or the third passive device lead via wire bonding,
    wherein the first passive device lead is electrically connected to the first external connection terminal lead via wire bonding,
    wherein the second passive device lead is electrically connected to a voltage application terminal of the protection IC, which applies a charge voltage and a discharge voltage, via wire bonding,
    wherein the third passive device lead is electrically connected to the source terminal of the first FET and the second internal connection terminal lead via wire bonding,
    wherein the fourth passive device lead is electrically connected to the second external connection terminal lead via wire bonding,
    wherein the fifth passive device lead is electrically connected to a source terminal of the second FET and the third external connection terminal lead via wire bonding,
    wherein the sixth passive device lead is electrically connected to a sensing terminal of the protection IC, which senses a charge/discharge state, via wire bonding,
    wherein a first resistor from among the plurality of passive devices is disposed between the first and second passive device leads,
    wherein a second resistor from among the plurality of passive devices is disposed between the fifth and sixth passive device leads,
    wherein a third resistor for forming a surge protection circuit from among the plurality of passive devices is disposed between the fourth and fifth passive device leads,
    wherein a first capacitor from among the plurality of passive devices is disposed between the second and third passive device leads,
    wherein a second capacitor from among the plurality of passive devices is disposed between the third and fifth passive device leads, and
    wherein a varistor for forming the surge protection circuit from among the plurality of passive devices is disposed in parallel with the third resistor and between the fourth and fifth passive device leads.

3. A package module of a battery protection circuit, the package module comprising:
- first and second internal connection terminal areas individually disposed at two side edges of the package module and for respectively disposing first and second internal connection terminals to be connected to a battery can including a bare cell;
- an external connection terminal area adjacent to the first internal connection terminal area and for disposing a plurality of external connection terminals; and
- a protection circuit area comprising a device area for disposing a plurality of passive devices for forming the battery protection circuit, and a chip area adjacent to the device area and for disposing a protection integrated circuit (IC) and a dual field effect transistor (FET) chip for forming the battery protection circuit, and disposed between the external connection terminal area and the second internal connection terminal area,
- wherein the package module is packaged to expose the plurality of external connection terminals on an upper surface of the package module, and to expose the first and second internal connection terminals on a lower surface of the package module,
- wherein the dual FET chip comprising first and second FETs having a common drain, and the protection IC for controlling overdischarge and overcharge are stacked vertically or are disposed adjacent to each other on the chip area,
- wherein the plurality of passive devices comprising at least one resistor and at least one capacitor are individually disposed to connect at least two of a plurality of conductive lines to each other on the device area,
- wherein the package module has a structure in which the chip area, the device area, the external connection terminal area, and the first and second internal connection terminal areas are disposed on one base substrate selected from the group consisting of a printed circuit board (PCB) substrate, a ceramic substrate, and a plastic substrate, first through third external connection terminals are disposed on the external connection terminal area, the first internal connection terminal extends from the first external connection terminal and is disposed on the first internal connection terminal area, the second internal connection terminal is disposed on the second internal connection terminal area, and first through sixth conductive lines extend to at least one area selected from the group consisting of the external connection terminal area, the chip area, and the second internal connection terminal area, and are disposed on the device area, and
- wherein a discharge blocking signal output terminal of the protection IC outputs a discharge blocking signal for turning off the first FET in an overdischarge state, and is electrically connected to a gate terminal of the first FET via wire bonding,
- wherein a charge blocking signal output terminal of the protection IC outputs a charge blocking signal for turning off the second FET in an overcharge state, and is electrically connected to a gate terminal of the second FET via wire bonding,
- wherein a reference voltage terminal of the protection IC is electrically connected to a source terminal of the first FET of the third conductive line via wire bonding,
- wherein the first conductive line is disposed on the device area, extends to the external connection terminal area, and is electrically connected to the first external connection terminal,
- wherein the second conductive line is disposed on the device area, extends to the chip area, and is electrically connected to a voltage application terminal of the protection IC, which applies a charge voltage and a discharge voltage, via wire bonding,
- wherein the third conductive line is disposed on the device area, extends to the chip area and the second internal connection terminal area, and is electrically connected to the source terminal of the first FET and the second internal connection terminal,
- wherein the fourth conductive line is disposed on the device area, extends to the external connection terminal area, and is electrically connected to the second external connection terminal,
- wherein the fifth conductive line is disposed on the device area, extends to the external connection terminal area, and is electrically connected to a source terminal of the second FET and the third external connection terminal,
- wherein the sixth conductive line is disposed on the device area, extends to the chip area, and is electrically connected to a sensing terminal of the protection IC, which senses a charge/discharge state,
- wherein a first resistor from among the plurality of passive devices is disposed between the first and second conductive lines,
- wherein a second resistor from among the plurality of passive devices is disposed between the fifth and sixth conductive lines,
- wherein a third resistor for forming a surge protection circuit from among the plurality of passive devices is disposed between the fourth and fifth conductive lines,
- wherein a first capacitor from among the plurality of passive devices is disposed between the second and third conductive lines,
- wherein a second capacitor from among the plurality of passive devices is disposed between the third and fifth conductive lines, and
- wherein a varistor for forming the surge protection circuit from among the plurality of passive devices is disposed in parallel with the third resistor and between the fourth and fifth conductive lines.

4. The package module of claim 3, wherein a positive temperature coefficient (PTC) thermistor (resistor) or a fuse for suppressing overcurrent of a battery pack is additionally disposed between the third conductive line and the second internal connection terminal.

5. The package module of claim 3, wherein the package module is mounted on the battery can so as to form a battery pack.

6. The package module of claim 3, wherein the package module has an upper case structure to be mounted on the battery can so as to form a battery pack.

* * * * *